United States Patent
Kim et al.

(10) Patent No.: US 9,136,830 B1
(45) Date of Patent: Sep. 15, 2015

(54) DATA SIGNAL RECEIVER, TRANSCEIVER SYSTEM AND METHOD OF RECEIVING DATA SIGNAL

(71) Applicant: Korea Advanced Institute of Science and Technology, Daejeon (KR)

(72) Inventors: Lee-Sup Kim, Daejeon (KR); Sang-Hye Chung, Daejeon (KR); Yong-Hun Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 14/666,988

(22) Filed: Mar. 24, 2015

(30) Foreign Application Priority Data

Mar. 27, 2014 (KR) .......................... 10-2014-0035856

(51) Int. Cl.
*H04L 7/06* (2006.01)
*H03K 5/1252* (2006.01)
*H04L 7/00* (2006.01)
*H03K 5/00* (2006.01)

(52) U.S. Cl.
CPC ............ *H03K 5/1252* (2013.01); *H04L 7/0025* (2013.01); *H03K 2005/00013* (2013.01)

(58) Field of Classification Search
CPC ........... H04L 7/06; H04L 7/03; H04L 7/0025; H03K 5/1252
USPC .......................................................... 375/354
See application file for complete search history.

(56) References Cited

U.S. PATENT DOCUMENTS

| 2001/0021235 A1* | 9/2001 | Schenk | 375/365 |
| 2012/0126865 A1* | 5/2012 | Yamaguchi | 327/146 |

* cited by examiner

*Primary Examiner* — Jaison Joseph
(74) *Attorney, Agent, or Firm* — H.C. Park & Associates, PLC

(57) ABSTRACT

A data signal receiver includes a clock signal filter, a falling pulse signal generator, a mixing block, and a sampler. The clock signal filter generates a first filtered clock signal and a second filtered clock signal by filtering a clock signal. The falling pulse signal generator generates a falling pulse signal based on the first filtered clock signal. The mixing block generates a mixed data signal by mixing a data signal and the falling pulse signal. The sampler generates a recovered data signal by sampling the mixed data signal in response to the second filtered clock signal.

15 Claims, 14 Drawing Sheets

DATA SIGNAL RECEIVER, TRANSCEIVER SYSTEM AND METHOD OF RECEIVING DATA SIGNAL

CROSS-REFERENCE TO RELATED APPLICATION

This U.S. Non-provisional application claims priority under 35 USC §119 to Korean Patent Application No. 10-2014-0035856, filed on Mar. 27, 2014, in the Korean Intellectual Property Office (KIPO), the disclosure of which is incorporated by reference in its entirety herein.

BACKGROUND

1. Technical Field

Example embodiments relate generally to data signal receiver, and more particularly to data signal receiver enhancing a jitter correlation between data signal and clock signal, transceiver system including the same, and a method of receiving data signal with enhanced jitter correlation between data signal and clock signal.

2. Discussion of the Related Art

Recently, developing low-power & low-performance processors and linking the low-power & low-performance processors with high speed is evaluated as a better strategy on the processor market than developing one high-power & high-performance processor. It is necessary to develop a high-speed transceiver system among processors, between processor and memory, and between processor and peripheral component.

The transceiver system may have an embedded-clock architecture or a forwarded-clock architecture. The forwarded-clock architecture may be called as source synchronous parallel link (SSPL) architecture.

The embedded-clock architecture doesn't require a channel for a clock signal because it transfer only data signal through channels to other chips. But, the embedded-clock architecture requires a clock & data recovery (CDR) circuit to recover the clock signal from the data signal. Because of power consumption and execution time of the CDR circuit, the embedded-clock architecture is not appropriate to high-speed & low-power transceiver system.

The SSPL architecture transfers data signal and clock signal after synchronizing with a clock synthesizer. Because SSPL architecture does not require CDR circuit and a jitter of the data signal and a jitter of the clock signal has high correlation each other, the SSPL architecture is appropriate to high-speed & low-power transceiver system.

Problems blocking development of the SSPL architecture are amplification of clock signal jitter on the channel, generation of uncorrelated jitter on a clock distribution network (CDN), and a latency mismatch between the data signal and the clock signal. To solve the problems, a latency removing method and a clock signal jitter filtering method are proposed.

The latency removing method adds latency to the data signal as much as latency of the clock signal artificially. The latency removing method has advantage that latency difference between the data signal and the clock signal may be reduced, and the jitter correlation between the data signal and the clock signal may be increased. The latency removing method has disadvantage that power noise induced jitter in proportion to length of delay signal line occurs, and power consumption may be increased.

The clock signal jitter filtering method filters high frequency jitter component, which reduces correlation between the data signal and the clock signal, from the clock signal. Because the clock signal jitter filtering method uses oscillators having a filtering function, it is easy for implementation and consumes less power. The clock signal jitter filtering method has disadvantage that not all of the high frequency jitter components may be removed and the high frequency jitter component may be replaced with a phase noise.

SUMMARY

At least one example embodiment of the inventive concept provides a data signal receiver generating a recovered data signal through jitter filtering by mixing high frequency jitter component removed clock signal and the data signal. The recovered data signal includes low frequency jitter, which highly correlates to low frequency jitter of the clock signal, and the recovered data signal hardly includes medium and high frequency jitter.

At least one example embodiment of the inventive concept provides a transceiver system including the data signal receiver.

At least one example embodiment of the inventive concept provides a method of generating a recovered data signal through jitter filtering by mixing high frequency jitter component removed clock signal and the data signal. The recovered data signal includes low frequency jitter, which highly correlates to low frequency jitter of the clock signal, and the recovered data signal hardly include medium and high frequency jitter.

According to example embodiments, a data signal receiver includes a clock signal filter, a falling pulse signal generator, a mixing block, and a sampler. The clock signal filter generates a first filtered clock signal and a second filtered clock signal by filtering a clock signal. The falling pulse signal generator generates a falling pulse signal based on the first filtered clock signal. The mixing block generates a mixed data signal by mixing a data signal and the falling pulse signal. The sampler generates a recovered data signal by sampling the mixed data signal in response to the second filtered clock signal.

In an example embodiment, the data signal may include an inphase data signal and an antiphase data signal having 180 degree phase lag compared to the inphase data signal. The clock signal may include an inphase clock signal and an antiphase clock signal having 180 degree phase lag compared to the inphase clock signal. The first filtered clock signal may include a first inphase filtered clock signal, a first quadrature phase lag filtered clock signal having 90 degree phase lag compared to the first inphase filtered clock signal, a first antiphase filtered clock signal having 180 degree phase lag compared to the first inphase filtered clock signal, and a first quadrature phase lead filtered clock signal having 90 degree phase lead compared to the first inphase filtered clock signal. The second filtered clock signal may include a second inphase filtered clock signal, and a second antiphase filtered clock signal having 180 degree phase lag compared to the second inphase filtered clock signal. The falling pulse signal may include an inphase falling pulse signal, and an antiphase falling pulse signal having the 180 degree phase lag compared to the inphase falling pulse signal. The mixed data signal may include an inphase mixed data signal, and an antiphase mixed data signal having 180 degree phase lag compared to the inphase mixed data signal. The recovered data signal may include an inphase recovered data signal, and an antiphase recovered data signal having 180 degree phase lag compared to the inphase recovered data signal.

In an example embodiment, the clock signal filter may include a first phase interpolator, a second phase interpolator, and an injection-locked oscillator. The first phase interpolator may generate a phase interpolated clock signal by interpolating phase of the clock signal based on a feedback signal. The second phase interpolator may generate the second filtered clock signal by interpolating phase of the phase interpolated clock signal based on a deskew signal. The ILO may generate the first filtered clock signal based on the phase interpolated clock signal.

In an example embodiment, the injection-locked oscillator may operate as a low pass filter removing high frequency component of the phase interpolated clock signal.

In an example embodiment, the falling pulse signal generator may include a first XOR gate, and a second XOR gate. The first XOR gate may generate the inphase falling pulse signal by performing XOR operation on the first inphase filtered clock signal and the first quadrature phase lag filtered clock signal. The second XOR gate may generate the antiphase falling pulse signal by performing XOR operation on the first antiphase filtered clock signal and the first quadrature phase lead filtered clock signal.

In an example embodiment, the mixing block may include a mixer and a buffer. The mixer may generate a first inphase signal and a first antiphase signal having 180 degree phase lag compared to the first inphase signal by mixing the inphase data signal, the antiphase data signal, the inphase falling pulse signal, and the antiphase falling pulse signal. The buffer may generate the inphase mixed data signal by buffering the first inphase signal, and may generate the antiphase mixed data signal by buffering the first antiphase signal.

In an example embodiment, the mixer may operate in a buffer mode when the inphase falling pulse signal has logical value 1. The mixer may output the inphase data signal as the first inphase signal in the buffer mode. The mixer may output the antiphase data signal as the first antiphase signal in the buffer mode. The mixer may operate as a mix mode when the inphase falling pulse signal has logical value 0. The mixer may output an average value of supply voltage and ground voltage as the first inphase signal in the mix mode. The mixer may output the average value as the first antiphase signal in the mix mode.

In an example embodiment, the sampler may include a first register and a second register. The first register may store a value of the inphase mixed data signal at an edge of the second inphase filtered clock signal as the inphase recovered data signal, and may output the inphase recovered data signal. The second register may store a value of the antiphase mixed data signal at an edge of the second antiphase filtered clock signal as the antiphase recovered data signal, and may output the antiphase recovered data signal.

In an example embodiment, the first register may store the value of the inphase mixed signal at a rising edge and a falling edge of the second inphase filtered clock signal as the inphase recovered data signal, and may output the inphase recovered data signal.

In an example embodiment, the second register may store the value of the antiphase mixed signal at a rising edge and a falling edge of the second antiphase filtered clock signal as the antiphase recovered data signal, and may output the antiphase recovered data signal.

In an example embodiment, the data signal receiver may further include a calibrator configured to generate a feedback signal corresponding to a phase difference between a delayed data signal and the mixed data signal. The delayed data signal may be generated by delaying the data signal.

In an example embodiment, the calibrator may include a delay circuit, a phase difference detection circuit, and a control circuit. The delay circuit may generate the delayed data signal by delaying the data signal. The phase difference detection circuit may generate a phase difference signal representing phase difference between the delayed data signal and the mixed data signal. The control circuit may generate the feedback signal corresponding to the phase difference signal.

In an example embodiment, the clock signal filter may control a phase of the first filtered clock signal and a phase of the second filtered clock signal based on the feedback signal, respectively.

According to example embodiments, a transceiver system includes a data signal transmitter, a clock signal transmitter, a data signal transfer channel, a clock signal transfer channel, and a data signal receiver. The data signal transmitter generates a second data signal by synchronizing a first data signal based on an output signal of a phase locked loop. The clock signal transmitter generates a second clock signal by synchronizing a first clock signal based on the output signal of the phase locked loop. The data signal transfer channel receives the second data signal from the a terminal of the data signal transfer channel, and outputs a third data signal through the other terminal of the data signal transfer channel. The clock signal transfer channel receives the second clock signal from a terminal of the clock signal transfer channel, and outputs a third clock signal through the other terminal of the clock signal transfer channel. The data signal receiver generates a first filtered clock signal and a second filtered clock signal by filtering the third clock signal. The data signal receiver generates a recovered data signal by sampling a mixed data signal generated by mixing the third data signal and a falling pulse signal which is generated based on the first filtered clock signal.

According to example embodiments, a method of receiving data signal includes a generating a first filtered clock signal and a second filtered clock signal by filtering a clock signal, a generating a falling pulse signal based on the first filtered clock signal, a generating a mixed data signal by mixing a data signal and the falling pulse signal, and a generating a recovered data signal by sampling the mixed data signal in response to the second filtered clock signal.

As described above, the data signal receiver according to example embodiments may generate a recovered data signal through jitter filtering by mixing high frequency jitter component removed clock signal and the data signal. The recovered data signal includes low frequency jitter, which highly correlates to low frequency jitter of the clock signal, and the recovered data signal hardly includes medium and high frequency jitter. High-speed & low-power signal transfer among chips may be possible by using the data signal receiver.

BRIEF DESCRIPTION OF THE DRAWINGS

Example embodiments of the inventive concept will be more clearly understood from the following detailed description taken in conjunction with the accompanying drawings.

DETAILED DESCRIPTION OF THE EMBODIMENTS

Figure 1:
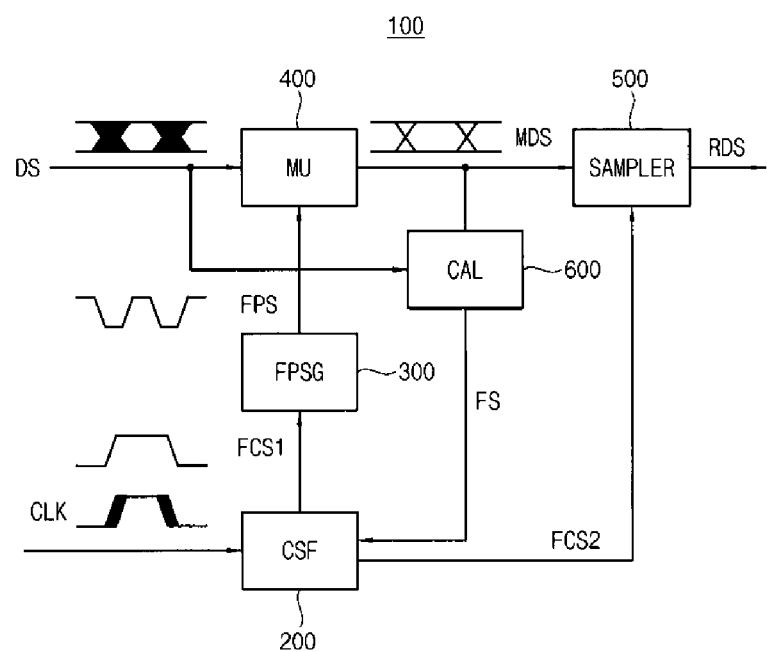
FIG. 1 is a block diagram illustrating a data signal receiver according to an example embodiment.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a data signal receiver according to an example embodiment.

Referring to FIG. 1, a data signal receiver 100 includes a clock signal filter CSF 200, a falling pulse signal generator FPSG 300, a mixing block MU 400, and a sampler 500. The data signal receiver 100 may further include a calibrator CAL 600.

The clock signal filter 200 generates a first filtered clock signal FCS1 and a second filtered clock signal FCS2 by filtering a clock signal CLK. The falling pulse signal generator 300 generates a falling pulse signal FPS based on the first filtered clock signal FCS1. The mixing block 400 generates a mixed data signal MDS by mixing a data signal DS and the falling pulse signal FPS. The sampler 500 generates a recovered data signal RDS by sampling the mixed data signal MDS in response to the second filtered clock signal FCS2. The calibrator 600 may generate a feedback signal FS corresponding to a phase difference between a delayed data signal and the mixed data signal MDS. The delayed data signal may be generated by delaying the data signal DS. The clock signal filter 200 may control a phase of the first filtered clock signal FCS1 and a phase of the second filtered clock signal FCS2 based on the feedback signal FS, respectively.

The clock signal filter 200 will be described with the references to FIGS. 2 through 6. The falling pulse signal generator 300 will be described with the reference to FIG. 7, the mixing block 400 will be described with the references to FIGS. 8 through 10, the sampler 500 will be described with the reference to FIG. 11, and the calibrator 600 will be described with the reference to FIG. 12.

Figure 2:
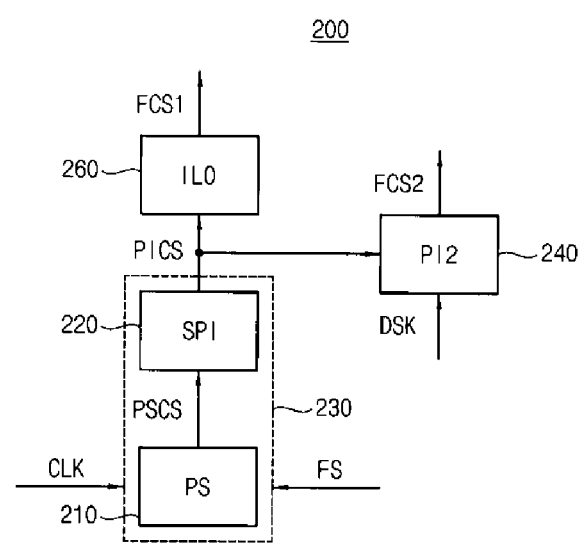
FIG. 2 is a block diagram illustrating the clock signal filter included in the data signal receiver of FIG. 1.

FIG. 2 is a block diagram illustrating the clock signal filter included in the data signal receiver of FIG. 1.

Referring to FIG. 2, the clock signal filter 200 may include a first phase interpolator 230, a second phase interpolator 240, and an injection-locked oscillator ILO 260. The first phase interpolator 230 includes a phase selector PS 210 and a sub phase interpolator SPI 220.

The first phase interpolator 230 may generate a phase interpolated clock signal PICS by interpolating phase of the clock signal CLK based on a feedback signal FS. The phase selector 210 may generate a phase selected clock signal PSCS based on the clock signal CLK and the feedback signal FS. The sub phase interpolator 220 may generate the phase interpolated clock signal PICS based on the phase selected clock signal PSCS and the feedback signal FS. The second phase interpolator 240 may generate the second filtered clock signal FCS2 by interpolating phase of the phase interpolated clock signal PICS based on a deskew signal DSK. The ILO 260 may generate the first filtered clock signal FCS1 based on the phase interpolated clock signal PICS. The ILO 260 may operate as a low pass filter removing high frequency component of the phase interpolated clock signal PICS.

The phase selector 210 will be described with the reference to FIG. 3, the sub phase interpolator 220 will be described with the reference to FIG. 4, the second phase interpolator 240 will be described with the reference to FIG. 5, and the ILO 260 will be described with the reference to FIG. 6.

Figure 3:
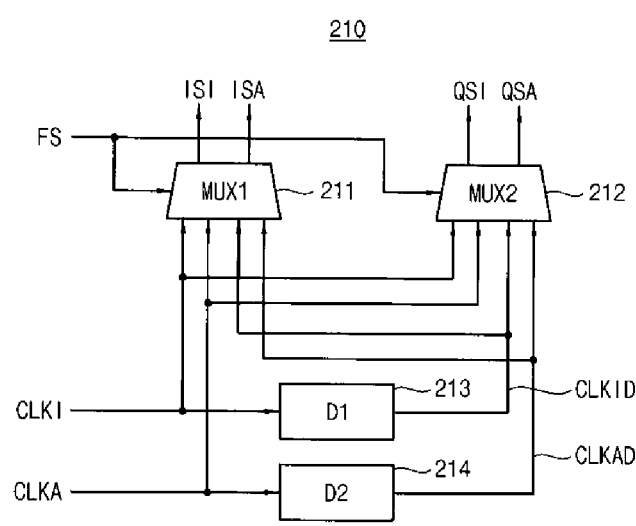
FIG. 3 is a block diagram illustrating the phase selector included in the clock signal filter of FIG. 2.

FIG. 3 is a block diagram illustrating the phase selector included in the clock signal filter of FIG. 2.

Referring to FIG. 3, the phase selector 210 includes a first multiplexer MUX1 211, a second multiplexer MUX2 212, a first delay unit D1 213, and a second delay unit D2 214. The clock signal CLK may include an inphase clock signal CLKI and an antiphase clock signal CLKA having 180 degree phase lag compared to the inphase clock signal CLKI. The phase selected clock signal PSCS may include an inphase selected clock signal ISI, a quadrature phase lag selected clock signal QSI having 90 degree phase lag compared to the inphase selected clock signal ISI, a antiphase selected clock signal ISA having 180 degree phase lag compared to the inphase selected clock signal ISI, and a quadrature phase lead selected clock signal QSA having 90 degree phase lead compared to the inphase selected clock signal ISI.

The first delay unit 213 may generate a first delayed clock signal CLKID having 90 degree phase lag compared to the inphase clock signal CLKI. The second delay unit 214 may generate a second delayed clock signal CLKAD having 90 degree phase lag compared to the antiphase clock signal CLKA.

The first multiplexer 211 may output one of the inphase clock signal CLKI, the first delayed clock signal CLKID, the antiphase clock signal CLKA, and the second delayed clock signal CLKAD as the inphase selected clock signal ISI in response to the feedback signal FS. The first multiplexer 211 may output one of the inphase clock signal CLKI, the first delayed clock signal CLKID, the antiphase clock signal CLKA, and the second delayed clock signal CLKAD as the antiphase selected clock signal ISA in response to the feedback signal FS. The antiphase selected clock signal ISA has 180 degree phase lag compared to the inphase selected clock signal ISI.

The second multiplexer 212 may output one of the inphase clock signal CLKI, the first delayed clock signal CLKID, the antiphase clock signal CLKA, and the second delayed clock signal CLKAD as the quadrature phase lag selected clock signal QSI in response to the feedback signal FS. The quadrature phase lag selected clock signal QSI has 90 degree phase lag compared to the inphase selected clock signal ISI. The second multiplexer 212 may output one of the inphase clock signal CLKI, the first delayed clock signal CLKID, the antiphase clock signal CLKA, and the second delayed clock signal CLKAD as the quadrature phase lead selected clock signal QSA in response to the feedback signal FS. The quadrature phase lead selected clock signal QSA has 90 degree phase lead compared to the inphase selected clock signal ISI.

Figure 4:
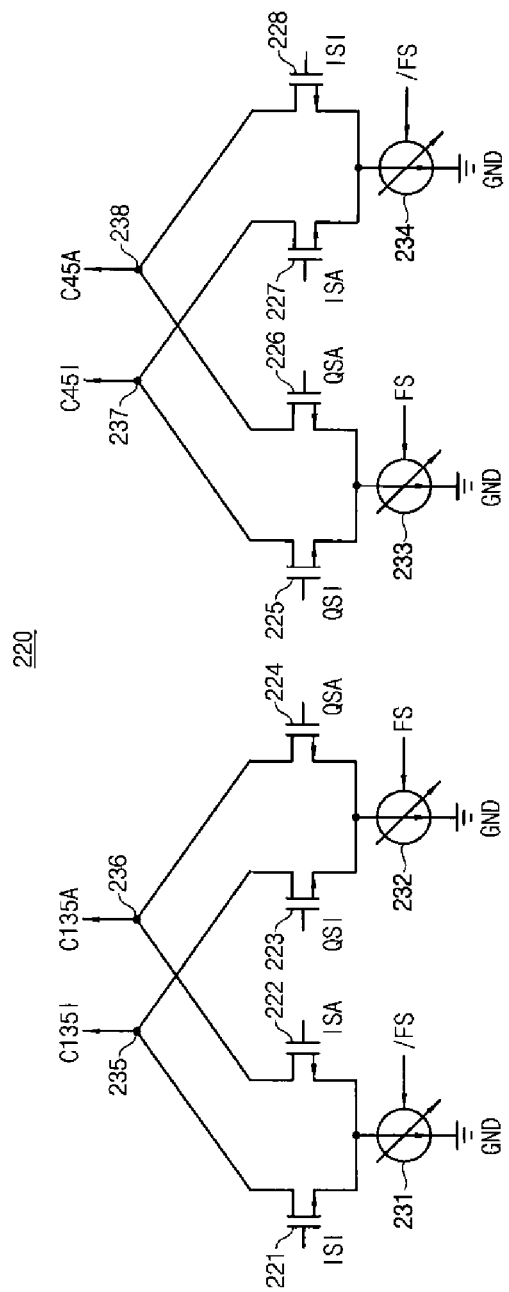
FIG. 4 is a block diagram illustrating the sub phase interpolator included in the clock signal filter of FIG. 2.

FIG. 4 is a block diagram illustrating the sub phase interpolator included in the clock signal filter of FIG. 2.

Referring to FIG. 4, the sub phase interpolator 220 may include a plurality of transistors 211 through 228 and a plurality of current sources 231 through 234. The phase interpolated clock signal PICS may include a first internal clock signal C135I, a second internal clock signal C135A, a third internal clock signal C45I, and a fourth internal clock signal C45A.

A source terminal of the first transistor 221 and a source terminal of the second transistor 222 are connected to a terminal of the first current source 231. The other terminal of the first current source 231 receives the ground voltage GND. Amount of current generated by the first current source 231 is in proportion to strength of a complementary signal/FS of the feedback signal FS. A source terminal of the third transistor 223 and a source terminal of the fourth transistor 224 are connected to a terminal of the second current source 232. The other terminal of the second current source 232 receives the ground voltage GND. Amount of current generated by the second current source 232 is in proportion to strength of the feedback signal FS. A source terminal of the fifth transistor 225 and a source terminal of the sixth transistor 226 are connected to a terminal of the third current source 233. The other terminal of the third current source 233 receives the ground voltage GND. Amount of current generated by the third current source 233 is in proportion to strength of the feedback signal FS. A source terminal of the seventh transistor 227 and a source terminal of the eighth transistor 228 are connected to a terminal of the fourth current source 234. The other terminal of the fourth current source 234 receives the ground voltage GND. Amount of current generated by the fourth current source 234 is in proportion to strength of the complementary signal/FS.

The inphase selected clock signal ISI is applied to a gate terminal of the first transistor 221 and a gate terminal of the eighth transistor 228. The antiphase selected clock signal ISA is applied to a gate terminal of the second transistor 222 and a gate terminal of the seventh transistor 227. The quadrature phase lag selected clock signal QSI is applied to a gate terminal of the third transistor 223 and a gate terminal of the fifth transistor 225. The quadrature phase lead selected clock signal QSA is applied to a gate terminal of the fourth transistor 224 and a gate terminal sixth transistor 226.

A drain terminal of the first transistor 221 and a drain terminal of the third transistor 223 are connected to a first node 235. The first internal clock signal C135I is outputted from the first node 235. A drain terminal of the second transistor 222 and a drain terminal of the fourth transistor 224 are connected to a second node 236. The second internal clock signal C135A is outputted from the second node 236. A drain terminal of the fifth transistor 225 and a drain terminal of the seventh transistor 227 are connected to a third node 237. The third internal clock signal C45I is outputted from the third node 237. A drain terminal of the sixth transistor 226 and a drain terminal of the eighth transistor 228 are connected to a fourth node 238. The fourth internal clock signal C45A is outputted from the fourth node 238.

The first internal clock signal C135I is generated by adding a current, which has a phase of the inphase selected clock signal ISI and generated by the first transistor 221 and the first current source 231, and a current, which has a phase of the quadrature phase lag selected clock signal QSI and generated by the third transistor 223 and the second current source 232. The first internal clock signal C135I may have a phase between a first phase and a second phase according to the strength of the feedback signal FS. The first phase is an opposite to a phase of the inphase selected clock signal ISI. The second phase is a phase of the quadrature phase lag selected clock signal QSI. The second internal clock signal C135A, the third internal clock signal C45I, and the fourth internal clock signal C45A may be understood based on the description about the first internal clock signal C135I.

The second internal clock signal C135A has 180 degree phase lag compared to the first internal clock signal C135I. The third internal clock signal has 90 degree phase lead compared to the first internal clock signal C135I. The fourth internal clock signal has 90 degree phase lag compared to the first internal clock signal C135I.

Figure 5:
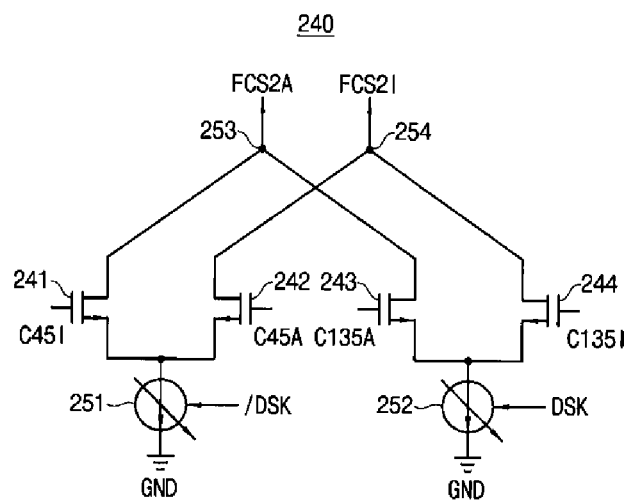
FIG. 5 is a block diagram illustrating the second phase interpolator included in the clock signal filter of FIG. 2.

FIG. 5 is a block diagram illustrating the second phase interpolator included in the clock signal filter of FIG. 2.

Referring to FIG. 5, the second phase interpolator 240 includes a plurality of transistors 241 through 244, and a plurality of current sources 251, 252. The second filtered clock signal FCS2 may include a second inphase filtered clock signal FCS2I, and a second antiphase filtered clock signal FCS2A having 180 degree phase lag compared to the second inphase filtered clock signal FCS2I.

A source terminal of the first transistor 241 and a source terminal of the second transistor 242 are connected to a terminal of the first current source 251. The other terminal of the first current source 251 receives the ground voltage GND. Amount of current generated by the first current source 251 is in proportion to strength of a complementary signal /DSK of the deskew signal DSK. A source terminal of the third transistor 243 and a source terminal of the fourth transistor 244 are connected to a terminal of the second current source 252. The other terminal of the second current source 252 receives the ground voltage GND. Amount of current generated by the second current source 252 is in proportion to strength of the deskew signal DSK.

The third internal clock signal C45I is applied to a gate terminal of the first transistor 241. The fourth internal clock signal C45A is applied to a gate terminal of the second transistor 242. The second internal clock signal C135A is applied to a gate terminal of the third transistor 243. The first internal clock signal C135I is applied to a gate terminal of the fourth transistor 244.

A drain terminal of the first transistor 241 and a drain terminal of the third transistor 243 are connected to a first node 253. The second antiphase filtered clock signal FCS2A is outputted from the first node 253. A drain terminal of the second transistor 242 and a drain terminal of the fourth transistor 244 are connected to a second node 254. The second inphase filtered clock signal FCS2I is outputted from the second node 254.

The second antiphase filtered clock signal FCS2A is generated by adding a current, which has a phase of the third internal clock signal C45I and generated by the first transistor 241 and the first current source 251, and a current, which has a phase of the fourth internal clock signal C45A and generated by the third transistor 243 and the second current source 252. The second antiphase filtered clock signal FCS2A may have a phase between a first phase and a second phase according to the strength of the deskew signal DSK. The first phase is an opposite to a phase of the third internal clock signal C45I. The second phase is a phase of the second internal clock signal C135A. The second inphase filtered clock signal FCS2I may be understood based on the description about the second antiphase filtered clock signal FCS2A.

Figure 6:
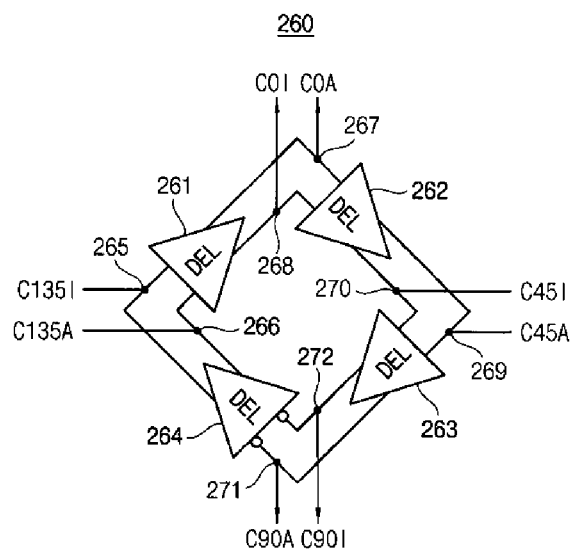
FIG. 6 is a block diagram illustrating the injection-locked oscillator included in the clock signal filter of FIG. 2.

FIG. 6 is a block diagram illustrating the injection-locked oscillator included in the clock signal filter of FIG. 2.

Referring to FIG. 6, the injection-locked oscillator ILO 260 may include a plurality of delay unit 261 through 264. The first filtered clock signal FCS1 may include a first inphase filtered clock signal C0I, a first quadrature phase lag filtered clock signal C90I having 90 degree phase lag compared to the first inphase filtered clock signal C0I, a first antiphase filtered clock signal C0A having 180 degree phase lag compared to the first inphase filtered clock signal C0I, and a first quadrature phase lead filtered clock signal C90A having 90 degree phase lead compared to the first inphase filtered clock signal C0I.

The first internal clock signal C135I is applied to a first node 265. The second internal clock signal C135A is applied to a second node 266. The fourth internal clock signal C45A is applied to a fifth node 269. The third internal clock signal C45I is applied to a sixth node 270. The first antiphase filtered clock signal C0A is outputted from a third node 267. The first inphase filtered clock signal C0I is outputted from a fourth node 268. The first quadrature phase lead filtered clock signal C90A is outputted from a seventh node 271. The first quadrature phase lag filtered clock signal C90I is outputted from an eighth node 272.

The first delay unit 261 outputs the first antiphase filtered clock signal C0A by delaying the first internal clock signal C135I as much as 45 degree. The first delay unit 261 outputs the first inphase filtered clock signal C0I by delaying the second internal clock signal C135A as much as 45 degree. The second, third, and fourth delay units 262, 263, and 264 may be understood based on the description about the first delay unit 261.

Figure 7:
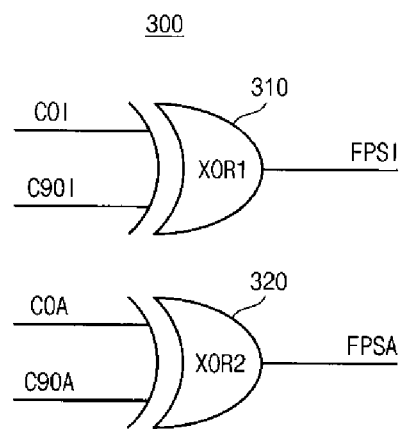
FIG. 7 is a block diagram illustrating the falling pulse signal generator included in the data signal receiver of FIG. 1.

FIG. 7 is a block diagram illustrating the falling pulse signal generator included in the data signal receiver of FIG. 1.

Referring to FIG. 7, the falling pulse signal FPS may include an inphase falling pulse signal FPSI, and an antiphase falling pulse signal FPSA having the 180 degree phase lag compared to the inphase falling pulse signal FPSI.

The falling pulse signal generator 300 may include a first XOR gate XOR1 310, and a second XOR gate XOR2 320. The first XOR gate 310 may generate the inphase falling pulse signal FPSI by performing XOR operation on the first inphase filtered clock signal C0I and the first quadrature phase lag filtered clock signal C90I. The second XOR gate 320 may generate the antiphase falling pulse signal FPSA by performing XOR operation on the first antiphase filtered clock signal C0A and the first quadrature phase lead filtered clock signal C90A.

Timing of the inphase falling pulse signal FPSI and the antiphase falling pulse signal FPSA will be described with the references to FIGS. 14a and 14b.

Figure 8:
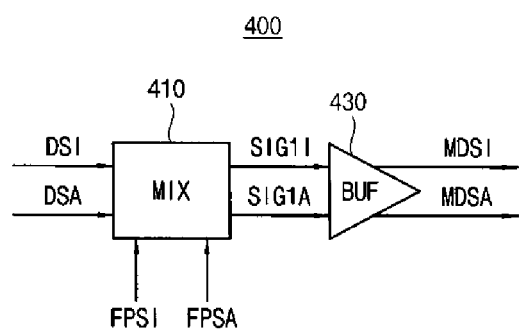
FIG. 8 is a block diagram illustrating the mixing block included in the data signal receiver of FIG. 1.

FIG. 8 is a block diagram illustrating the mixing block included in the data signal receiver of FIG. 1.

Referring to FIG. 8, the mixing block 400 may include a mixer MIX 410 and a buffer BUF 430. The data signal DS may include an inphase data signal DSI and an antiphase data signal DSA having 180 degree phase lag compared to the inphase data signal DSI. The mixed data signal MDS may include an inphase mixed data signal MDSI, and an antiphase mixed data signal MDSA having 180 degree phase lag compared to the inphase mixed data signal MDSI.

The mixer 410 may generate a first inphase signal SIG1I and a first antiphase signal SIG1A having 180 degree phase lag compared to the first inphase signal SIG1I by mixing the inphase data signal DSI, the antiphase data signal DSA, the inphase falling pulse signal FPSI, and the antiphase falling pulse signal FPSA. The buffer 430 may generate the inphase mixed data signal MDSI by buffering the first inphase signal SIG1I, and may generate the antiphase mixed data signal MDSA by buffering the first antiphase signal SIG1A. The mixer 410 will be described with the references to FIGS. 9 and 10. The buffer 430 may have the same or the similar structure with a conventional buffer.

Figure 9:
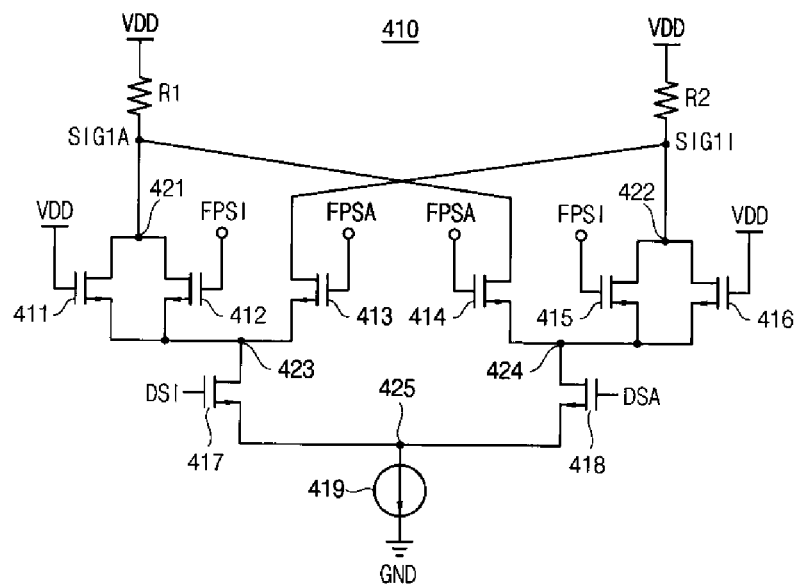
FIG. 9 is a circuit diagram illustrating the mixer included in the mixing block of FIG. 8.

FIG. 9 is a circuit diagram illustrating the mixer included in the mixing block of FIG. 8.

Referring to FIG. 9, the mixer 410 includes a plurality of resistors R1, R2, a plurality of transistors 411 through 418, and a current source 419.

A terminal of the first resistor R1 receives the supply voltage VDD. The other terminal of the first resistor R1 is connected to the first node 421. A terminal of the second resistor R2 receives the supply voltage VDD. The other terminal of the second resistor R2 is connected to the second node 422. A drain terminal of the first transistor 411 and a drain terminal of the second transistor 412 are connected to the first node 421. A drain terminal of the third transistor 413 is connected to the second node 422. The supply voltage VDD is applied to a gate terminal of the first transistor 411. The inphase falling pulse signal FPSI is applied to a gate terminal of the second transistor 412. The antiphase falling pulse signal FPSA is applied to a gate terminal of the third transistor 413. Source terminals of the first through third transistors 411, 412, and 413 are connected to the third node 423. A drain terminal of the fourth transistor 414 is connected to the first node 421. A drain terminal of the fifth transistor 415 and a drain terminal of the sixth transistor 416 are connected to the second node 422. The antiphase falling pulse signal FPSA is applied to a gate terminal of the fourth transistor 414. The inphase falling pulse signal FPSI is applied to a gate terminal of the fifth transistor 415. The supply voltage VDD is applied to a gate terminal of the sixth transistor 416. Source terminals of the fourth through sixth transistors 414, 415, and 416 are connected to the fourth node 424. A source terminal of the seventh transistor 417 and a source terminal of the eighth transistor 418 are connected to a terminal of the current source 419. The other terminal of the current source 419 receives the ground voltage GND. The inphase data signal DSI is applied to a gate terminal of the seventh transistor 417. The antiphase data signal DSA is applied to a gate terminal of the eighth transistor 418. A drain terminal of the seventh transistor 417 is connected to the third node 423. A drain terminal of the eighth transistor 418 is connected to the fourth node 424. The first antiphase signal SIG1A is outputted from the first node 421, and the first inphase signal SIG1I is outputted from the second node 422.

When the inphase falling pulse signal FPSI has logical value 1 (the supply voltage VDD) and the antiphase falling pulse signal FPSA has logical value 0 (the ground voltage GND), the first, second, fifth, and sixth transistors 411, 412, 415, and 416 are turned-on and the third and fourth transistors 413, 414 are turned-off. When the inphase data signal DSI has logical value 1 and the antiphase data signal DSA has logical value 0, the mixer 410 outputs logical value 0 as the first antiphase signal SIG1A and outputs logical value 1 as the first inphase signal SIG1I. When the inphase data signal DSI has logical value 0 and the antiphase data signal DSA has logical value 1, the mixer 410 outputs logical value 1 as the first antiphase signal SIG1A and outputs logical value 0 as the first inphase signal SIG1I. In other words, the mixer 410 outputs the inphase data signal DSI as the first inphase signal SIG1I and outputs the antiphase data signal DSA as the first antiphase signal SIG1A in a buffer mode.

When the inphase falling pulse signal FPSI has logical value 0 and the antiphase falling pulse signal FPSA has logical value 1, the first, third, fourth, and sixth transistors 411, 413, 414, and 416 are turned-on and the second and fifth transistors 412, 415 are turned-off. In this case, the first, second, third, and fourth nodes 421, 422, 423, and 424 are connected each other. The mixer 410 outputs an average value of the supply voltage VDD and the ground voltage GND as the first inphase signal SIG1I and the first antiphase signal SIG1A in a mix mode.

Figure 10:
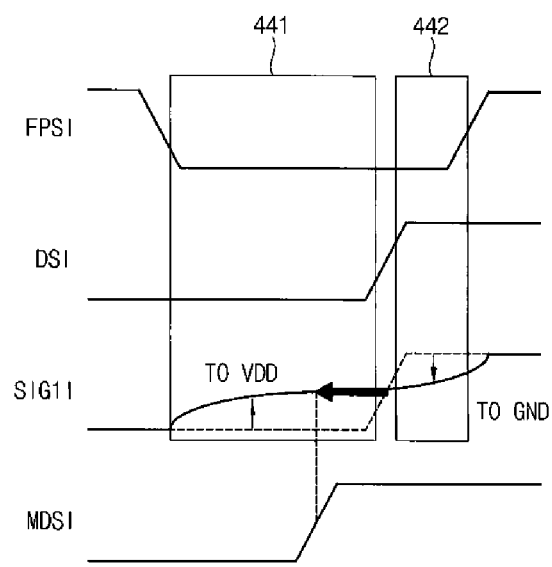
FIG. 10 is a timing diagram illustrating operation of the mixing block of FIG. 8.

FIG. 10 is a timing diagram illustrating operation of the mixing block of FIG. 8.

Referring to FIG. 10, because the inphase falling pulse signal FPSI has logical value 0 in the first period 441, the mixer 410 operates in the mix mode. The first inphase signal SIG1I moves from logical value 0 to logical Value ½, which represents the average value of the supply voltage VDD and the ground voltage GND.

Because the inphase falling pulse signal FPSI has logical value 0 in the second period 442, the mixer 410 operates in the mix mode. The first inphase signal SIG1I moves from logical value 1 to logical value ½.

In result, the mixing block 400 generates the inphase mixed data signal MDSI having an edge at first time point which is closer to center of signal wave form in which the inphase falling pulse signal FPSI maintains logical value 0 than second time point of an edge of the inphase data signal DSI. While the inphase falling pulse signal FPSI has logical value 1, the mixer 410 outputs the inphase data signal DSI as the inphase mixed data signal MDSI.

The antiphase falling pulse signal FPSA, the antiphase data signal DSA, the first antiphase signal SIG1A, and the antiphase mixed data signal MDSI of the mixing block 400 may be understood based on the description.

Figure 11:
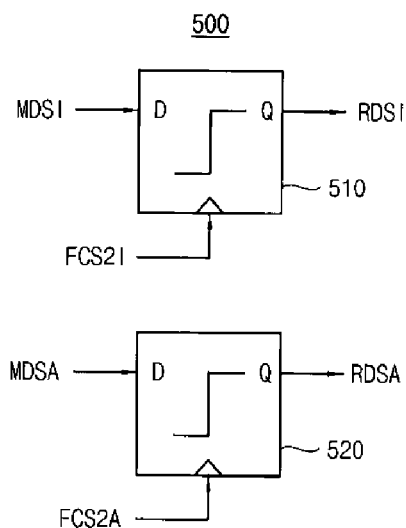
FIG. 11 is a block diagram illustrating the sampler included in the data signal receiver of FIG. 1.

FIG. 11 is a block diagram illustrating the sampler included in the data signal receiver of FIG. 1.

Referring to FIG. 11, the sampler 500 may include a first register 510 and a second register 520. The recovered data signal RDS may include an inphase recovered data signal RDSI, and an antiphase recovered data signal RDSA having 180 degree phase lag compared to the inphase recovered data signal RDSI.

The first register 510 may store a value of the inphase mixed data signal MDSI at an edge of the second inphase filtered clock signal FCS2I as the inphase recovered data signal RDSI, and may output the inphase recovered data signal RDSI. The second register 520 may store a value of the antiphase mixed data signal MDSA at an edge of the second antiphase filtered clock signal FCS2A as the antiphase recovered data signal RDSA, and may output the antiphase recovered data signal RDSA.

The first register 510 may store the value of the inphase mixed signal MDSI at a rising edge and a falling edge of the second inphase filtered clock signal FCS2I as the inphase recovered data signal RDSI, and may output the inphase recovered data signal RDSI. The second register 520 may store the value of the antiphase mixed signal MDSA at a rising edge and a falling edge of the second antiphase filtered clock signal FCS2A as the antiphase recovered data signal RDSA, and may output the antiphase recovered data signal RDSA.

Figure 12:
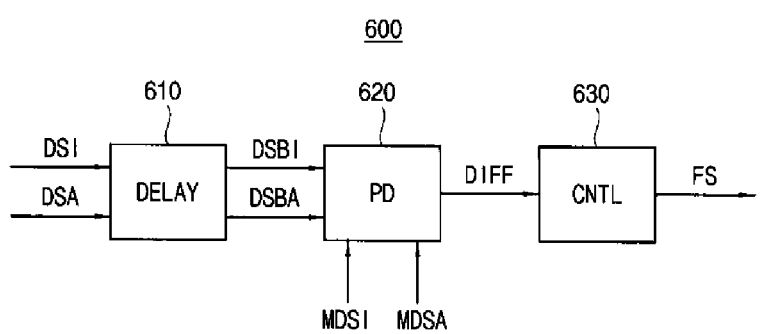
FIG. 12 is a block diagram illustrating the calibrator included in the data signal receiver included in FIG. 1.

FIG. 12 is a block diagram illustrating the calibrator included in the data signal receiver included in FIG. 1.

Referring to FIG. 12, the calibrator 600 may include a delay circuit DELAY 610, a phase difference detection circuit PD 620, and a control circuit CTRL 630. The delay circuit 610 may generate the delayed data signal DSBI, DSBA by delaying the data signal DSI, DSA. The phase difference detection circuit 620 may generate a phase difference signal DIFF representing phase difference between the delayed data signal DSBI, DSBA and the mixed data signal MDSI, MDSA. The control circuit 630 may generate the feedback signal FS corresponding to the phase difference signal DIFF.

Figure 13A:
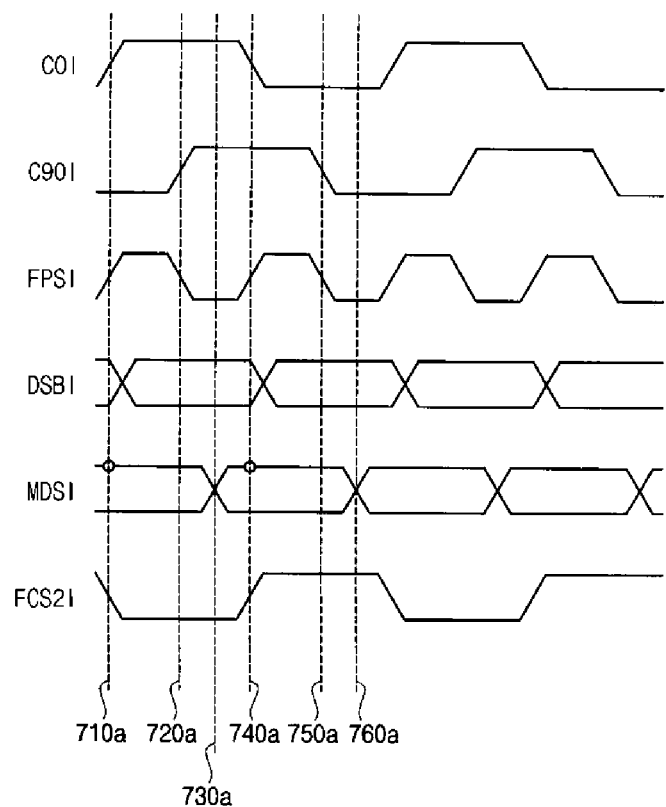
FIGS. 13A, 13B, and 13C are timing diagrams illustrating calibration procedure of the data signal receiver of FIG. 1.
Figure 13B:
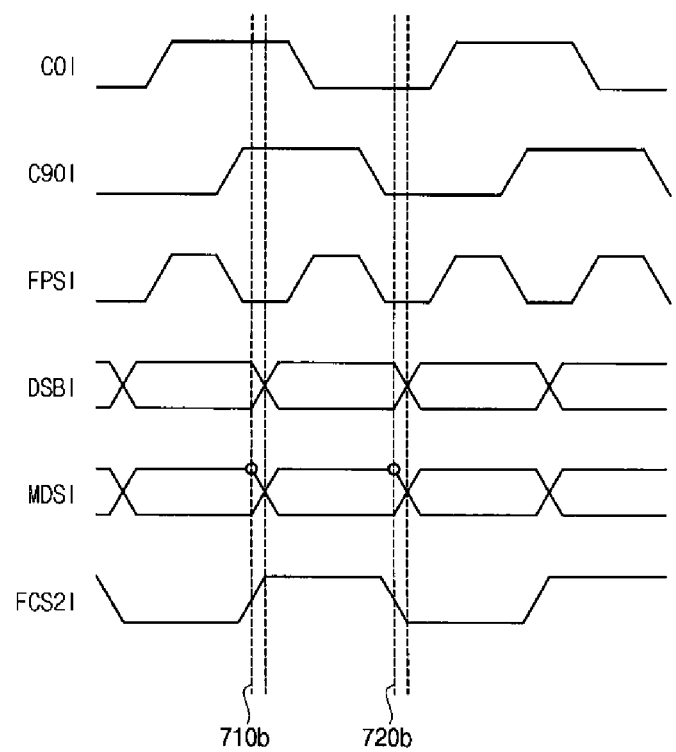
Figure 13C:
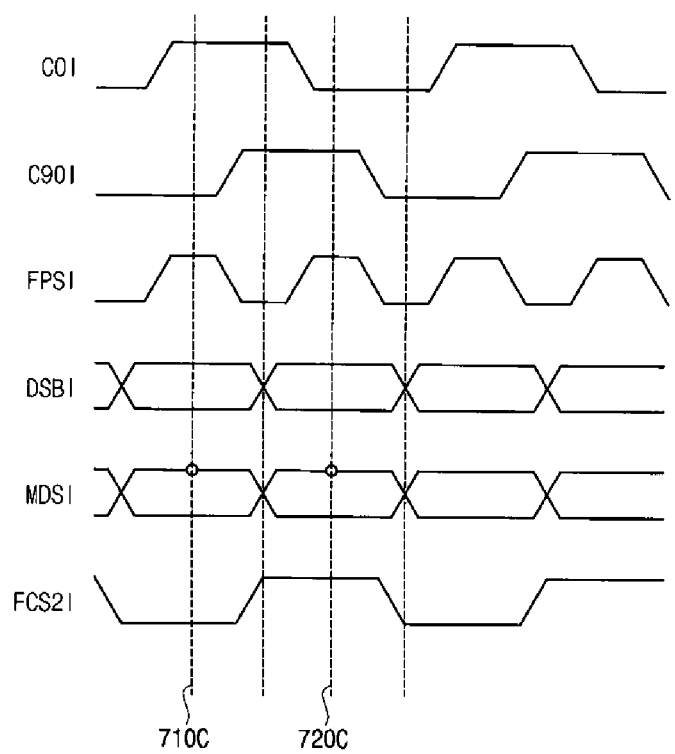

FIGS. 13A through 13C are timing diagrams illustrating calibration procedure of the data signal receiver of FIG. 1.

FIG. 13A is a timing diagram illustrating signals of the data signal receiver 100 before calibration.

Referring to FIG. 13A, the falling pulse signal generator 300 generates the inphase falling pulse signal FPSI by performing XOR operation on the first inphase filtered clock signal C0I and the first quadrature phase lag filtered clock signal C90I.

In detail, at the first time point 710a, because the first inphase filtered clock signal C0I is changed from logical value 0 to logical value 1 and the first quadrature phase lag filtered clock signal C90I maintains logical value 0, the inphase falling pulse signal FPSI is changed from logical value 0 to logical value 1. At the second time point 720a, because the first inphase filtered clock signal C0I maintains logical value 1 and the first quadrature phase lag filtered clock signal C90I is changed from logical value 0 to logical value 1, the inphase falling pulse signal FPSI is changed from logical value 1 to logical value 0. At the fourth time point 740a, because the first inphase filtered clock signal C0I is changed from logical value 1 to logical value 0 and the first quadrature phase lag filtered clock signal C90I maintains logical value 1, the inphase falling pulse signal FPSI is changed from logical value 0 to logical value 1. At the fifth time point 750a, because the first inphase filtered clock signal C0I maintains logical value 0 and the first quadrature phase lag filtered clock signal C90I is changed from logical value 1 to logical value 0, the inphase falling pulse signal FPSI is changed from logical value 1 to logical value 0.

The mixing block 400 may maximize mixing function when edge of the inphase delayed data signal DSBI and edge of the inphase mixed data signal MDSI exist on center point 730a, 760a of signal wave form in which the inphase falling pulse signal FPSI maintains logical value 0. In FIG. 13A, the inphase delayed data signal DSBI and the inphase mixed data signal MDSI are not synchronized each other.

In FIG. 13A, because phase difference between the inphase mixed data signal MDSI and the second inphase filtered clock signal FCS2I is less than 90 degree, the sampler 500 may sample the inphase mixed data signal MDSI with relatively small timing margin at the first time point 710a when a falling edge of the second inphase filtered clock signal FCS2I exists, and the fourth time point 740a when a rising edge of the second inphase filtered clock signal FCS2I exists.

FIG. 13B is a timing diagram illustrating signals of the data signal receiver 100 after calibration between the inphase delayed data signal DSBI and the inphase mixed data signal MDSI.

FIG. 13B shows a case that the first inphase filtered clock signal C0I, the first quadrature phase lag filtered clock signal C90I, the inphase falling pulse signal FPSI, and the inphase mixed data signal MDSI are synchronized based on the inphase delayed data signal DSBI and the inphase falling pulse signal FPSI by controlling the feedback signal FS.

In FIG. 13B, because phase difference between the inphase mixed data signal MDSI and the second inphase filtered clock signal FCS2I is less than 90 degree, the sampler 500 may sample the inphase mixed data signal MDSI with a timing margin less than the timing margin of FIG. 13B at the first time point 710b when a rising edge of the second inphase filtered clock signal FCS2I exists, and the second time point 720b when a falling edge of the second inphase filtered clock signal FCS2I exists.

FIG. 13C is a timing diagram illustrating signals of the data signal receiver 100 after calibration between the inphase mixed data signal MDSI and the second inphase filtered clock signal FCS2I.

FIG. 13C shows a case that the first inphase filtered clock signal C0I, the first quadrature phase lag filtered clock signal C90I, the inphase falling pulse signal FPSI, and the inphase mixed data signal MDSI are synchronized based on the inphase delayed data signal DSBI and the inphase falling pulse signal FPSI by controlling the feedback signal FS and the inphase mixed data signal MDSI is set to have 90 degree phase lead compared to the second inphase filtered clock signal FCS2I by controlling the deskew signal DSK.

The sampler 500 may sample the inphase mixed data signal MDSI with maximum timing margin at the first time point 710C when a falling edge of the second inphase filtered clock signal FCS2I exists, and the second time point 720C when a rising edge of the second inphase filtered clock signal FCS2I exists.

The first antiphase filtered clock signal C0A, the first quadrature phase lead filtered clock signal C90A, the antiphase falling pulse signal FPSA, the antiphase delayed data signal DSBA, the antiphase mixed data signal MDSI, and the second antiphase filtered clock signal FCS2I may be understood based on the references to FIGS. 13A, 13B, and 13C.

Figure 14:
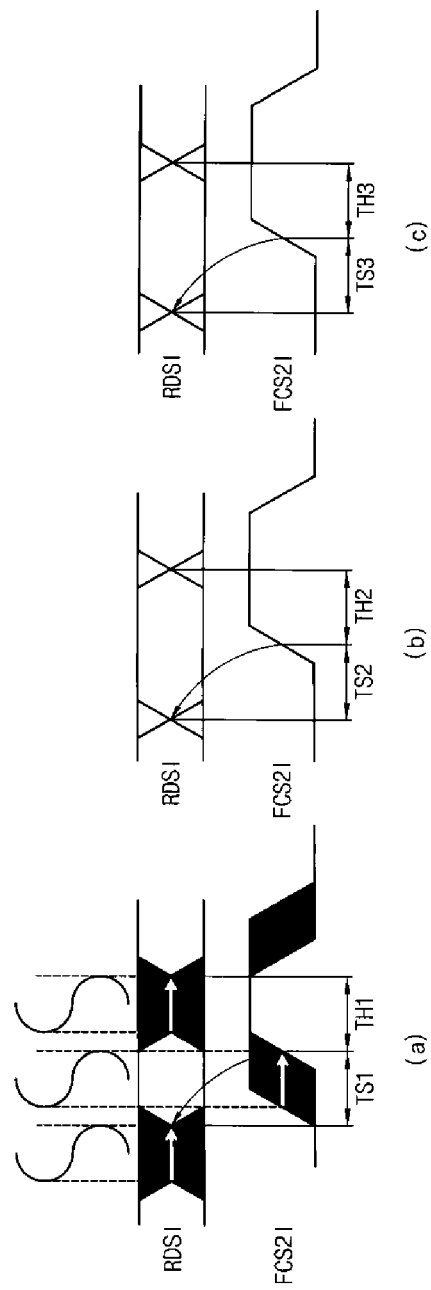
FIG. 14 is a timing diagram illustrating operation of the data signal receiver of FIG. 1.

FIG. 14 is a timing diagram illustrating operation of the data signal receiver of FIG. 1.

FIG. 14 at (a) shows a case that the data signal receiver 100 mixes low-frequency jitter of the inphase clock signal CLKI and the inphase data signal DSI. Because the low-frequency jitter of the inphase clock signal CLKI is not removed by the clock signal filter 200, the low-frequency jitter may be propagated to the inphase falling pulse signal FPSI, the inphase mixed data signal MDSI, the second inphase filtered clock signal FCS2I, and the inphase recovered data signal RDSI. Because the low-frequency jitter of the second inphase filtered clock signal FCS2I is the same as low-frequency jitter of the inphase recovered data signal RDSI and the inphase recovered data signal RDSI has 90 degree phase lead compared to the second inphase filtered clock signal FCS2I, a first setup time and a first hold time is set to 0.5 unit interval (UI).

FIG. 14 at (b) shows a case that the data signal receiver 100 mixes middle-frequency jitter of the inphase clock signal CLKI and the inphase data signal DSI. Because the middle-frequency jitter of the inphase clock signal CLKI is removed by the clock signal filter 200, the second inphase filtered clock signal FCS2I and the inphase recovered data signal RDSI do not include the middle-frequency jitter, and the inphase recovered data signal RDSI has 90 degree phase lead compared to the second inphase filtered clock signal FCS2I, a second setup time and a second hold time is set to 0.5 UI.

FIG. 14 at (c) shows a case that the data signal receiver 100 mixes high-frequency jitter of the inphase clock signal CLKI and the inphase data signal DSI. Because the high-frequency jitter of the inphase clock signal CLKI is removed by the clock signal filter 200, the second inphase filtered clock signal FCS2I and the inphase recovered data signal RDSI do not include the high-frequency jitter, and the inphase recovered data signal RDSI has 90 degree phase lead compared to the second inphase filtered clock signal FCS2I, a third setup time and a third hold time is set to 0.5 UI.

Figure 15:
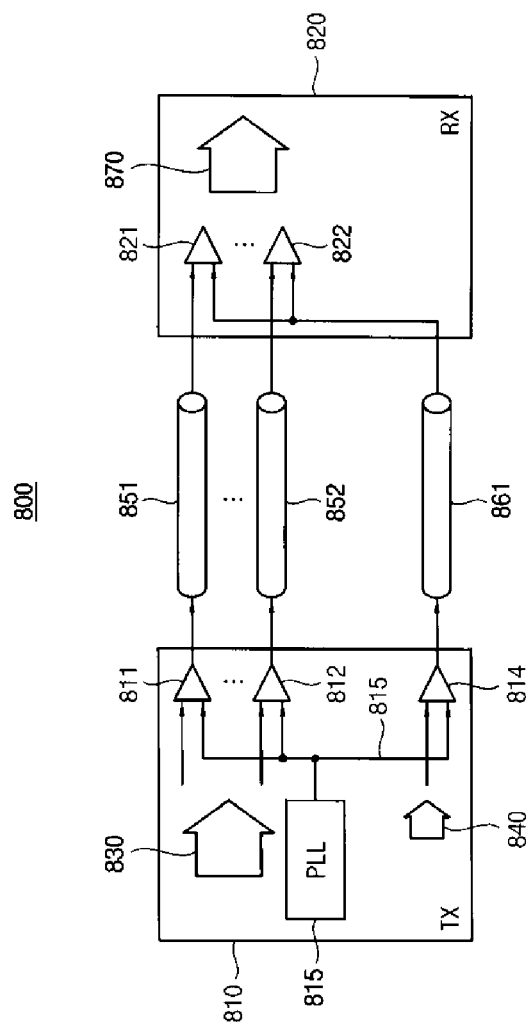
FIG. 15 is a block diagram illustrating a transceiver system according to an example embodiment.

FIG. 15 is a block diagram illustrating a transceiver system according to an example embodiment.

Referring to FIG. 15, a transceiver system 800 includes a transmitter TX 810, a data signal transfer channel 851, 852, a clock signal transfer channel 861, and a receiver RX 820. The transmitter 810 includes a data signal transmitter 811, 812, a phase locked loop PLL 815, and a clock signal transmitter 814. The receiver 820 includes a data signal receiver 821, 822.

The data signal transmitter 811, 812 generates a second data signal by synchronizing a first data signal 830 based on an output signal 815 of the phase locked loop 815. The clock signal transmitter 814 generates a second clock signal by synchronizing a first clock signal 840 based on the output signal 815 of the phase locked loop 815. The data signal transfer channel 851, 852 receives the second data signal from the a terminal of the data signal transfer channel 851, 852, and outputs a third data signal through the other terminal of the data signal transfer channel 851, 852. The clock signal transfer channel 861 receives the second clock signal from a terminal of the clock signal transfer channel 861, and outputs a third clock signal through the other terminal of the clock signal transfer channel 861. The data signal receiver 821, 822 generates a first filtered clock signal and a second filtered clock signal by filtering the third clock signal. The data signal receiver 821, 822 generates a recovered data signal 870 by sampling a mixed data signal generated by mixing the third data signal and a falling pulse signal which is generated based on the first filtered clock signal.

The data signal receiver 821, 822 may have the same or the similar structure with the data signal receiver 100 of FIG. 1. The data signal receiver 821, 822 may be understood based on the references to FIGS. 1 through 16.

Figure 16:
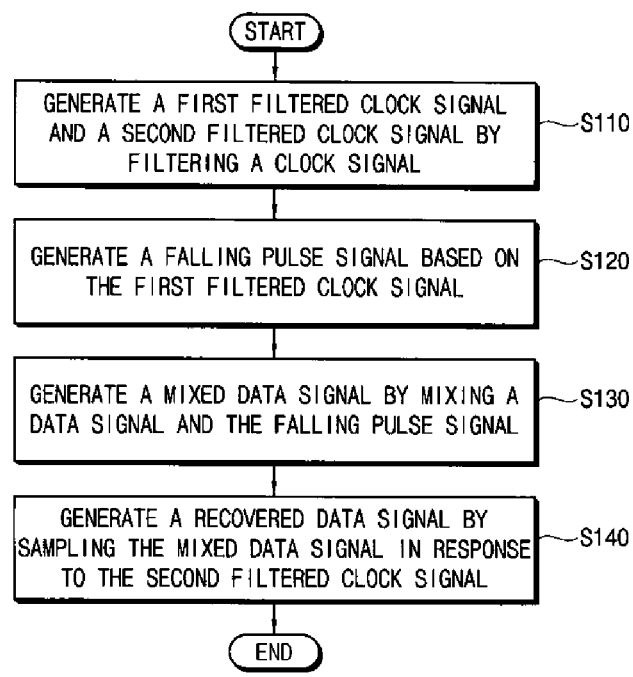
FIG. 16 is a flow chart illustrating a method of receiving data signal according to an example embodiment.

FIG. 16 is a flow chart illustrating a method of receiving data signal according to an example embodiment.

Referring to FIG. 16, a method of receiving data signal includes a generating a first filtered clock signal and a second filtered clock signal by filtering a clock signal (S110), a generating a falling pulse signal based on the first filtered clock signal (S120), a generating a mixed data signal by mixing a data signal and the falling pulse signal (S130), and a generating a recovered data signal by sampling the mixed data signal in response to the second filtered clock signal (S140).

The steps (S110 through S140) may be understood based on the references to FIGS. 1 through 16.

The data signal receiver according to example embodiments may be used in all transceiver system transferring data signal and clock signal through channel. In detail, the data signal receiver may be used in signal transceiver system between processor and memory, between graphic process GPU and memory, between processor to peripheral, and between processor to processor. In addition, the data signal receiver may be used in a hyper transport transceiver system, a double data rate (DDR) transceiver system, and a quick path interface (QPI) transceiver system.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A data signal receiver comprising:
a clock signal filter configured to generate a first filtered clock signal and a second filtered clock signal by filtering a clock signal;
a falling pulse signal generator configured to generate a falling pulse signal based on the first filtered clock signal;
a mixing block configured to generate a mixed data signal by mixing a data signal and the falling pulse signal; and
a sampler configured to generate a recovered data signal by sampling the mixed data signal in response to the second filtered clock signal.

2. The data signal receiver of claim 1, wherein the data signal includes an inphase data signal and an antiphase data signal having 180 degree phase lag compared to the inphase data signal,
wherein the clock signal includes an inphase clock signal and an antiphase clock signal having 180 degree phase lag compared to the inphase clock signal,
wherein the first filtered clock signal includes a first inphase filtered clock signal, a first quadrature phase lag filtered clock signal having 90 degree phase lag compared to the first inphase filtered clock signal, a first antiphase filtered clock signal having 180 degree phase lag compared to the first inphase filtered clock signal, and a first quadrature phase lead filtered clock signal having 90 degree phase lead compared to the first inphase filtered clock signal,
wherein the second filtered clock signal includes a second inphase filtered clock signal, and a second antiphase filtered clock signal having 180 degree phase lag compared to the second inphase filtered clock signal,
wherein the falling pulse signal includes an inphase falling pulse signal, and an antiphase falling pulse signal having the 180 degree phase lag compared to the inphase falling pulse signal,
wherein the mixed data signal includes an inphase mixed data signal, and an antiphase mixed data signal having 180 degree phase lag compared to the inphase mixed data signal,
wherein the recovered data signal includes an inphase recovered data signal, and an antiphase recovered data signal having 180 degree phase lag compared to the inphase recovered data signal.

3. The data signal receiver of claim 2, wherein the clock signal filter includes:
a first phase interpolator configured to generate a phase interpolated clock signal by interpolating phase of the clock signal based on a feedback signal;
a second phase interpolator configured to generate the second filtered clock signal by interpolating phase of the phase interpolated clock signal based on a deskew signal; and
an injection-locked oscillator (ILO) configured to generate the first filtered clock signal based on the phase interpolated clock signal.

4. The data signal receiver of claim 3, wherein the injection-locked oscillator operates as a low pass filter removing high frequency component of the phase interpolated clock signal.

5. The data signal receiver of claim 2, wherein the falling pulse signal generator includes:
a first XOR gate configured to generate the inphase falling pulse signal by performing XOR operation on the first inphase filtered clock signal and the first quadrature phase lag filtered clock signal; and
a second XOR gate configured to generate the antiphase falling pulse signal by performing XOR operation on the first antiphase filtered clock signal and the first quadrature phase lead filtered clock signal.

6. The data signal receiver of claim 2, wherein the mixing block includes:
a mixer configured to generate a first inphase signal and a first antiphase signal having 180 degree phase lag compared to the first inphase signal by mixing the inphase data signal, the antiphase data signal, the inphase falling pulse signal, and the antiphase falling pulse signal; and a buffer configured to generate the inphase mixed data signal by buffering the first inphase signal, configured to generate the antiphase mixed data signal by buffering the first antiphase signal.

7. The data signal receiver of claim 6, wherein the mixer operates in a buffer mode when the inphase falling pulse signal has logical value 1, the mixer outputs the inphase data signal as the first inphase signal in the buffer mode, and the mixer outputs the antiphase data signal as the first antiphase signal in the buffer mode,
wherein the mixer operates as a mix mode when the inphase falling pulse signal has logical value 0, the mixer outputs an average value of supply voltage and ground voltage as the first inphase signal in the mix mode, and the mixer outputs the average value as the first antiphase signal in the mix mode.

8. The data signal receiver of claim 2, wherein the sampler includes:
a first register configured to store a value of the inphase mixed data signal at an edge of the second inphase filtered clock signal as the inphase recovered data signal, configured to output the inphase recovered data signal, and
a second register configured to store a value of the antiphase mixed data signal at an edge of the second antiphase filtered clock signal as the antiphase recovered data signal, configured to output the antiphase recovered data signal.

9. The data signal receiver of claim 8, wherein the first register stores the value of the inphase mixed signal at a rising edge and a falling edge of the second inphase filtered clock signal as the inphase recovered data signal, and outputs the inphase recovered data signal.

10. The data signal receiver of claim 8, wherein the second register stores the value of the antiphase mixed signal at a rising edge and a falling edge of the second antiphase filtered clock signal as the antiphase recovered data signal, and outputs the antiphase recovered data signal.

11. The data signal receiver of claim 1 further comprising:
a calibrator configured to generate a feedback signal corresponding to a phase difference between a delayed data signal and the mixed data signal, the delayed data signal being generated by delaying the data signal.

12. The data signal receiver of claim 11, wherein the calibrator includes:
a delay circuit configured to generate the delayed data signal by delaying the data signal;
a phase difference detection circuit configured to generate a phase difference signal representing phase difference between the delayed data signal and the mixed data signal; and
a control circuit configured to generate the feedback signal corresponding to the phase difference signal.

13. The data signal receiver of claim 11, wherein the clock signal filter controls a phase of the first filtered clock signal and a phase of the second filtered clock signal based on the feedback signal, respectively.

14. A transceiver system comprising:
a data signal transmitter configured to generate a second data signal by synchronizing a first data signal based on an output signal of a phase locked loop;
a clock signal transmitter configured to generate a second clock signal by synchronizing a first clock signal based on the output signal of the phase locked loop;
a data signal transfer channel configured to receive the second data signal from the a terminal of the data signal transfer channel, configured to output a third data signal through the other terminal of the data signal transfer channel;
a clock signal transfer channel configured to receive the second clock signal from a terminal of the clock signal transfer channel, configured to output a third clock signal through the other terminal of the clock signal transfer channel; and
a data signal receiver configured to generate a first filtered clock signal and a second filtered clock signal by filtering the third clock signal, configured to generate a recovered data signal by sampling a mixed data signal generated by mixing the third data signal and a falling pulse signal which is generated based on the first filtered clock signal.

15. A method of receiving data signal comprising:
a generating a first filtered clock signal and a second filtered clock signal by filtering a clock signal;
a generating a falling pulse signal based on the first filtered clock signal;
a generating a mixed data signal by mixing a data signal and the falling pulse signal; and
a generating a recovered data signal by sampling the mixed data signal in response to the second filtered clock signal.

* * * * *